United States Patent
Lin et al.

[11] Patent Number: 5,989,997
[45] Date of Patent: Nov. 23, 1999

[54] METHOD FOR FORMING DUAL DAMASCENE STRUCTURE

[75] Inventors: Benjamin Szu-Min Lin, Tung Chui Chiayi; Jason Jenq, Pingtung, both of Taiwan

[73] Assignee: United Microelectronics Corp., Hsin-Chu, Taiwan

[21] Appl. No.: 09/061,659

[22] Filed: Apr. 17, 1998

[30] Foreign Application Priority Data

Feb. 16, 1998 [TW] Taiwan ................................. 87102086

[51] Int. Cl.⁶ .................................................. H01L 21/314
[52] U.S. Cl. ......................... 438/622; 438/624; 438/631; 438/633; 438/634; 438/637; 438/638; 438/640; 438/675; 438/692; 438/701; 438/703; 438/761; 438/713; 438/948; 430/311; 430/312; 430/314; 430/316; 430/317
[58] Field of Search ................................... 438/622–624, 438/626, 631–634, 637, 638, 640, 674–675, 687–688, 692, 701, 703, 713, 959, 948–951; 430/311–317

[56] References Cited

U.S. PATENT DOCUMENTS

| 5,328,553 | 7/1994 | Poon ........................................ 156/636 |
| 5,578,523 | 11/1996 | Fiordalice et al. ...................... 438/633 |
| 5,741,626 | 4/1998 | Jain et al. ............................... 430/314 |
| 5,801,094 | 9/1998 | Yew et al. ............................... 438/624 |
| 5,880,018 | 3/1999 | Boeck et al. ............................ 438/619 |
| 5,897,375 | 4/1999 | Watts et al. ............................. 438/693 |
| 5,920,790 | 7/1999 | Wetzel et al. ........................... 438/618 |
| 5,935,762 | 8/1999 | Dai et al. ................................ 430/312 |

*Primary Examiner*—Charles Bowers
*Assistant Examiner*—Thanh Nguyen

[57] ABSTRACT

A method for forming dual damascene metallic structure that utilizes the formation of a protective photoresist layer at the bottom of a vertical window to prevent damages to a device region in the substrate when subsequent etching operation is carried out to form a horizontal trench pattern. The protective photoresist layer at the bottom of the vertical window is formed by irradiating the photoresist layer with a dose of radiation having energy level insufficient to chemically dissociate the photoactive molecules of the photoresist layer near the bottom of the vertical window.

27 Claims, 5 Drawing Sheets

METHOD FOR FORMING DUAL DAMASCENE STRUCTURE

CROSS-REFERENCE TO RELATED APPLICATION

This application claims the priority benefit of Taiwan application serial no. 87102086, filed Feb. 16, 1998, the full disclosure of which is incorporated herein by reference.

BACKGROUND OF THE INVENTION

1. Field of Invention

The present invention relates to a method for manufacturing ultra large-scale integrated (ULSI) circuits. More particularly, the present invention relates to a method for patterning interconnects on a semiconductor wafer using a dual damascene process.

2. Description of Related Art

The dual damascene process, in which metal is skillfully buried inside patterned grooves in a substrate, is frequently used these days and has become one of the best methods for fabricating integrated circuits. Conventionally, metallic interconnects are formed by depositing a metallic layer over an insulating layer, for example, a silicon dioxide layer. Then, the insulating layer is etched to form a pattern of predefined conductive lines so that a vertical contact window can be formed between conductive layers. Thereafter, metallic material similar or dissimilar to the conductive layer is deposited into the contact window to complete vertical connection between the conductive layers.

FIG. 1 is a cross-sectional view showing a metallic interconnect above a semiconductor substrate fabricated according to a conventional method. As shown in FIG. 1, the method of fabrication includes providing a substrate 10, and then patterning a device area 11. Thereafter, a first insulating layer 12 is formed above the substrate 10 followed by patterning. Next, a first metallic layer 13 is deposited over the substrate 10 so that the first metallic layer 13 is electrically coupled to the device area 11 through a contact window 14. Similarly, a second insulating layer 15 is formed over the first metallic layer 13. Then, a second metallic layer 16 is formed over the second insulating layer 15 so that the second metallic layer 16 is electrically connected to the first metallic layer 13 through a contact window 17. Finally, a third insulating layer 19 is formed over the device to protect the structure.

A slant angle is made on the sidewalls of the contact window when the dialectric windows are etched to form contact windows 14 and 17. The slant angle ensures good continuity of the metallic layer when using the method discussed above. However, if the slant angle is too steep, the metal at the corner edges of the contact window can be damaged quite easily. On the other hand, if the slant angle is too gentle, although continuity in a metallic conductive line is greatly improved, wafer area occupation tends to increase so that compact window structures are difficult to achieve. Moreover, the dielectric windows and contact windows will create a rather uneven surface such that subsequent interconnect layer fabrication becomes very difficult. Although FIG. 1 is not drawn according to scale, it is obvious that the uneven upper surface can easily lead to reliability problems. One problem that can happen at the interface location S between the first metallic layer and the second metallic layer is short-circuiting. This is because the insulating layer in the neighborhood of S is too thin. Another problem that can happen is an open-circuit condition due to the formation of a thin metallic layer near O.

A dual damascene method of fabrication is now commonly used to resolve the above problems. FIGS. 2A through 2D are cross-sectional views showing the progression of manufacturing steps in producing a dual damascene interconnect structure in a semiconductor substrate according to a conventional dual damascene method. First, as shown in FIG. 2A, a substrate 30 is provided. On this substrate 30, patterned metallic layers 31 are already formed. Next, a dielectric layer 32 is formed above the substrate 30, and then the dielectric layer 32 is planarized so that its thickness is same as the vertical height of a subsequently formed plug. Thereafter, dielectric layer 33 and dielectric layer 34 are sequentially formed above the dielectric layer 32. In the subsequent step, using conventional photolithographic and etching methods, the dielectric layers 32, 33 and 34 are patterned to form a vertical window 36 exposing a metallic layer 31 on the substrate 30. Later, a photoresist layer 38 is formed over the substrate 30. Then, using a fixed dose of light 40, patterns on a photomask 41 are transferred to the photoresist layer 38.

Next, as shown in FIG. 2B, the photoresist layer 38 is developed. Hence, a horizontal trench pattern 42 is formed exposing the vertical window 36 and the metallic layer 31 below.

Subsequently, as shown in FIG. 2C, using the photoresist layer 38 as a mask and the dielectric layer 33 as an etching stop layer, an etching operation is performed. For example, an anisotropic etching process is used such that the horizontal trench pattern 42 is transferred down to the dielectric layer 34 to form a horizontal trench 42'.

Finally, as shown in FIG. 2D, the photoresist layer 38 is removed, and metallic material 44 is deposited into the vertical window 36 and the horizontal trench 42'. Subsequently, extra metallic material 44 deposited above the dielectric layer 34 is removed using a chemical-mechanical polishing (CMP) method to complete the fabrication of a dual damascene metallic structure.

The above dual damascene process is able to reduce problems caused by windows and metallic conductive lines, and will improve the tolerance of over-coverage problems. Furthermore, even at the lowest allowed errors of design rules, the integrity of the conductive lines can still be maintained. In addition, it can avoid all the problems caused by depositing a thin layer of insulating material or metal over a window having slanting sides. However, there is still the problem that the metallic layer 31 at the bottom of the vertical window 36 is exposed and unprotected, and so will be etched by the etchant in the process of forming the horizontal trench 42. Consequently, the metallic layer 31 can be easily damaged resulting in a change in device properties, and ultimately may have to be scrapped.

In light of the foregoing, there is a need to provide an improved method of forming dual damascene structures.

SUMMARY OF THE INVENTION

Accordingly, the present invention is to provide a method for forming a dual damascene interconnect structure, wherein through forming a residual photoresist layer as a protective cover over the substrate at the bottom of the vertical window, damages during the subsequent etching to form the horizontal trench is minimized.

In another aspect, the invention provides a method for increasing the degree of alignment between the conductive layer and the interconnecting window pattern below.

In yet another aspect, the invention is to reduce errors in deposition and deviations in processing parameters in order to increase packing density of ULSI wafers.

To achieve these and other advantages and in accordance with the purpose of the invention, as embodied and broadly described herein, the invention provides a method for forming a dual damascene interconnect structure. The method comprises the steps of first providing a substrate having a patterned metallic layer already formed thereon, and then sequentially forming a stack of insulating layers above the substrate. The stack of insulating layers includes a lower dielectric layer, an intermediate dielectric layer and an upper dielectric layer. Thereafter, the stack of insulating layers is patterned to form a vertical window exposing a portion of the metallic layer in the substrate. Next, a photoresist layer is formed over the stack. Then, the photoresist layer is exposed to light, and subsequently developed to form a horizontal trench pattern in the photoresist layer leaving behind a portion of the photoresist layer over the metallic layer at the bottom of the vertical window. Subsequently, using the horizontal trench pattern on the photoresist layer as a mask and the intermediate dielectric layer as an etching stop layer, etching is performed to transfer the horizontal trench pattern to the upper dielectric layer, thereby forming a horizontal trench. Finally, the photoresist layer is completely removed, and then metal is deposited into the vertical window and the horizontal trench. Consequently, a dual damascene interconnect structure is formed. Due to the presence of a residual photoresist layer at the bottom of the vertical window, the patterned metallic layer in the substrate is protected from damage when the horizontal trench is etched.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
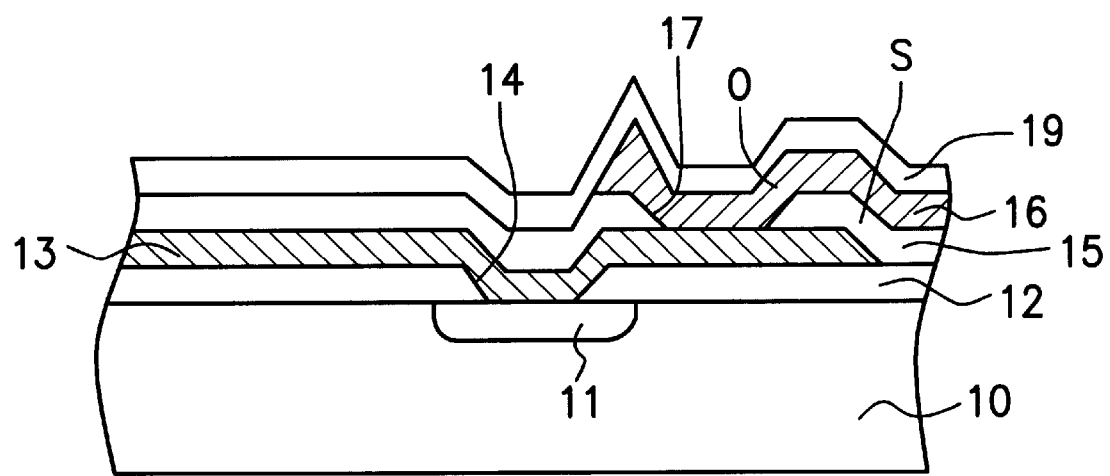
FIG. 1 is a cross-sectional view showing metallic interconnect on a semiconductor substrate fabricated according to a conventional method.
Figure 2A:
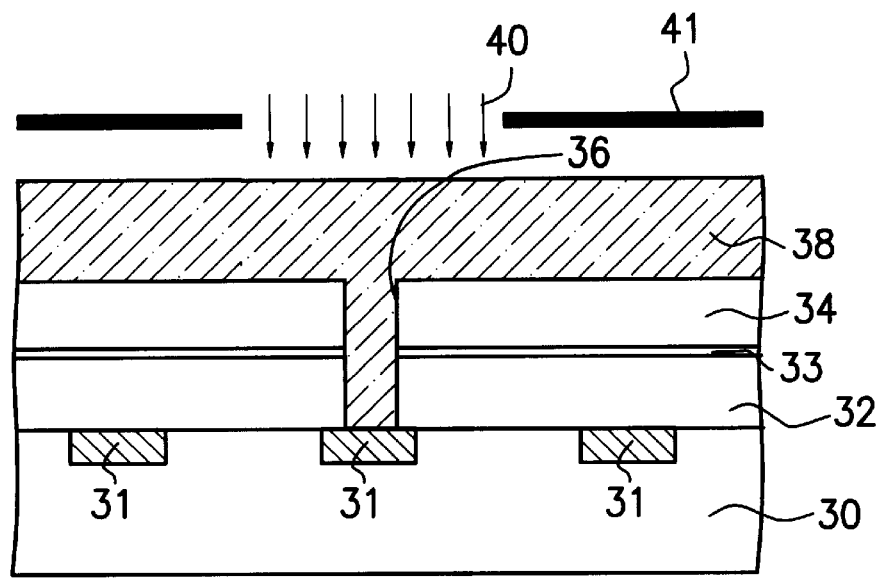
FIGS. 2A through 2D are cross-sectional views showing the progression of manufacturing steps in producing a dual damascene interconnect structure in a semiconductor substrate according to a conventional dual damascene method.
Figure 2B:
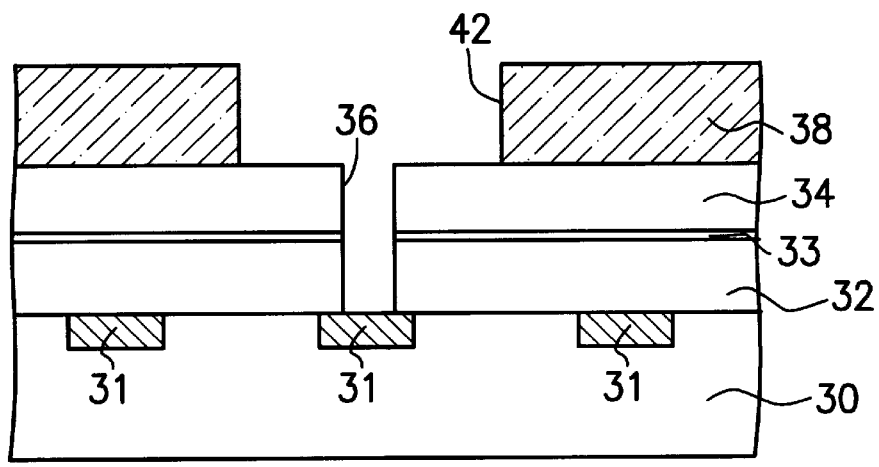
Figure 2C:
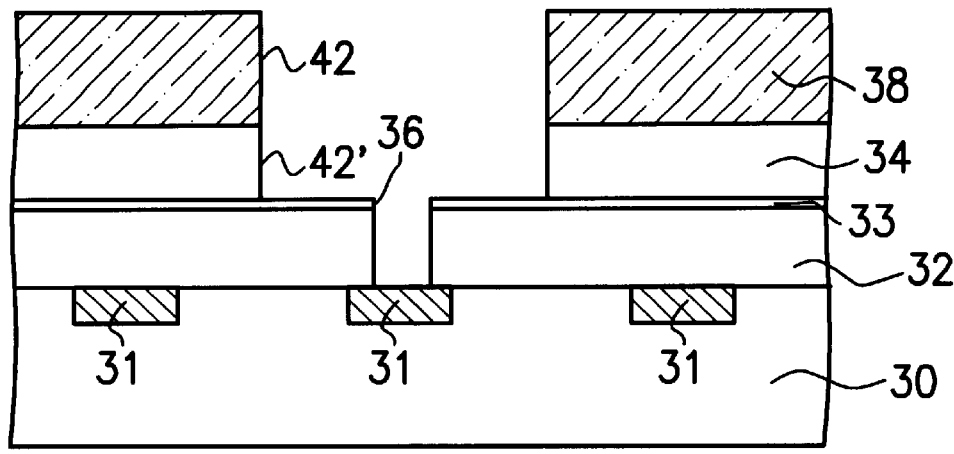
Figure 2D:
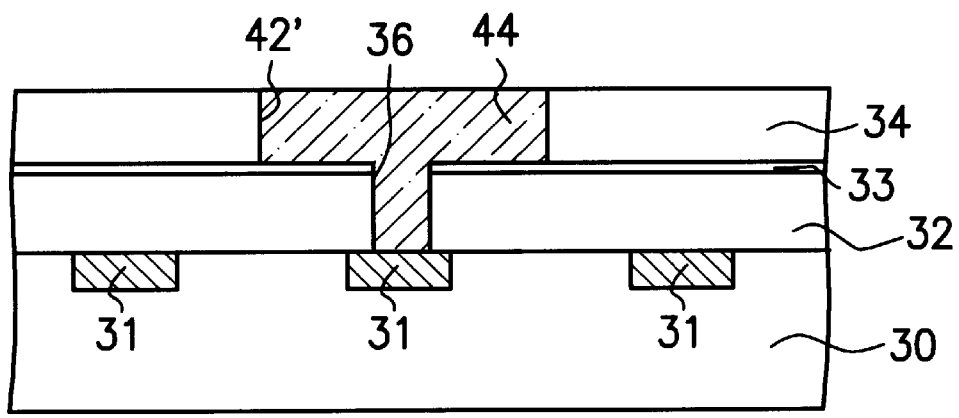

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3D are cross-sectional views showing the progression of manufacturing steps in producing a dual damascene interconnect structure in a semiconductor substrate according to one preferred embodiment of this invention.

Figure 3A:
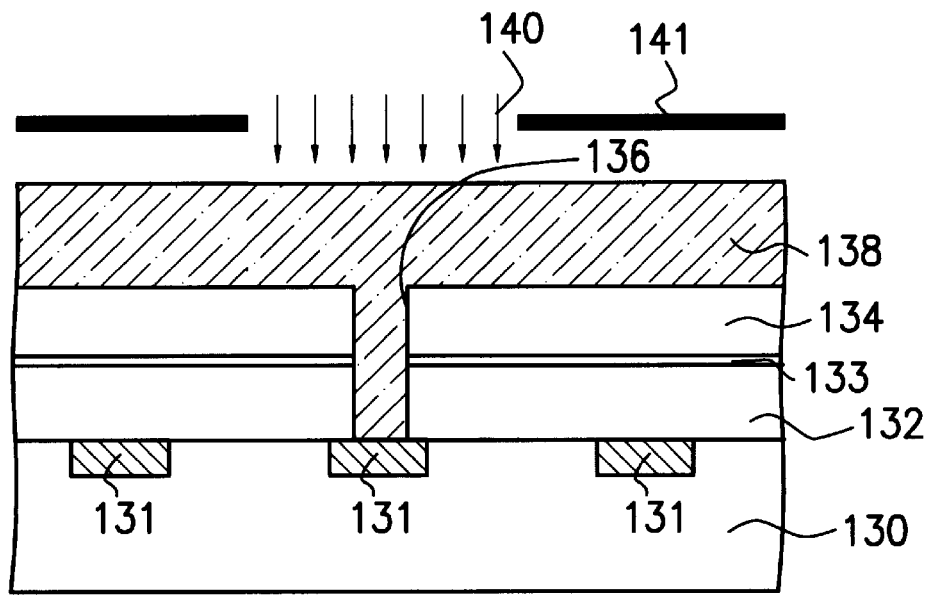
FIGS. 3A through 3D are cross-sectional views showing the progression of manufacturing steps in producing a dual damascene interconnect structure in a semiconductor substrate according to one preferred embodiment of this invention.

First, as shown in FIG. 3A, a substrate 130 having patterned metallic layers 131 formed thereon is provided. Then, a dielectric layer 132 is formed over the substrate 130, and the dielectric layer 132 is planarized so that its thickness is the necessary height for forming a vertical plug. Next, a dielectric layer 133 and a dielectric layer 134 are sequentially formed above the dielectric layer 132. The dielectric layers 132 and 134 can be a phosphosilicate glass (PSG) preferably having a thickness of about 3000 Å to 7000 Å deposited by, for example, a plasma-enhanced chemical vapor deposition (PECVD) method using a reaction chamber pressure of about 0.5 to 10 Torr, temperature of about 300° C. to 600° C., reacting gas silane having a flow rate of about 100 standard cubic centimeters per minute (sccm) to 500 sccm and carrier gas phosphine ($PH_3$) having a flow rate 20 sccm to 300 sccm. The dielectric layer 133 can be a silicon nitride layer preferably having a thickness of about 500 Å to 2000 Å deposited, for example, by a plasma-enhanced chemical vapor deposition (PECVD) method. The dielectric layer 133 can act as an etching stop layer in subsequent etching operation to form the required dual damascene pattern. The dielectric layer 134 can be planarized using, for example, a chemical-mechanical polishing (CMP) method. Other methods to planarize the dielectric layer 134 include etching back method and capping method as well. In the subsequent step, using conventional photolithographic and etching processes, the dielectric layers 132, 133 and 134 are patterned to form a vertical window 136 exposing a portion of the metallic layer 131 in the substrate 130.

Thereafter, a photoresist layer 138 is formed over the substrate 130. Then, a horizontal trench pattern 142 is completely transferred from a photomask to the photoresist layer 138 so that a portion of the photoresist layer 138 remains at the bottom of the vertical window 136 after subsequent development. This residual photoresist layer at the bottom of the vertical window 136 is an important aspect of this invention because it resolves the problems caused by conventional methods. The residual photoresist layer at the bottom of the vertical window 136 can be formed, for example, by exposure to a dose of light 140 that is insufficient to make the photoresist layer at the bottom of the vertical window 136 react, but sufficient to transfer the horizontal trench pattern from a dark field mask 141 to the positive photoactive photoresist layer 138. Because the depth of focus for the photoresist layer 138 inside the vertical window 138, especially near the bottom, is much greater than the dielectric layer 134 lying at the top, longer illumination is necessary. Therefore, when a dose of light slightly below normal is applied to the photoresist layer, a portion of the photoresist layer 138 near the bottom of the vertical window 136 is insufficiently exposed for molecular dissociation to occur. Consequently, a residual photoresist layer 138b will remain at the bottom of the vertical window 136 after subsequent development.

Figure 3B:
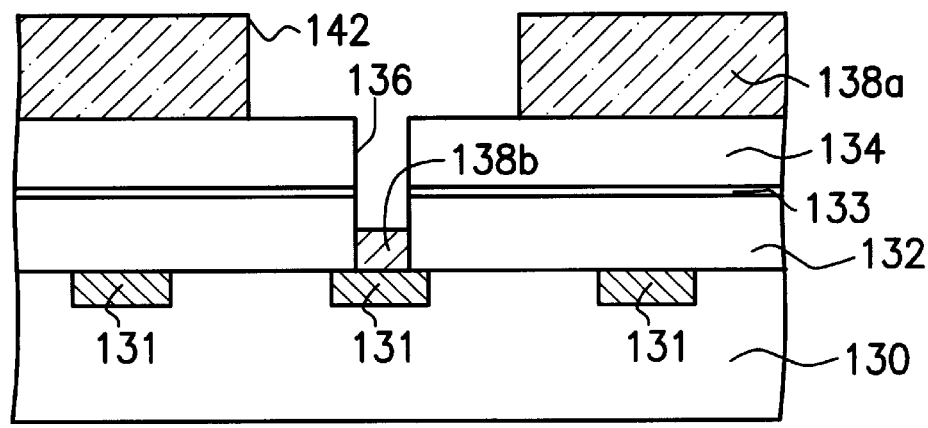

Next, as shown in FIG. 3B, the photoresist layer 138 is developed to form a photoresist layer 138a having a horizontal trench pattern 142 formed thereon and a residual photoresist layer 138b at the bottom of the vertical window 136. To develop the photoresist layer 138, a stream puddling technique is employed using a 2.38% TMAT solution to act on the positive photoactive photoresist layer 138 for about 40 to 70 seconds. The technique operates by dipping a wafer into a fixed quantity of developer for a preset period and then cleaning with steamy deionized water to terminate the action of the developer. Subsequently, the wafer is spin-dried. Detailed description of the stream puddling process can be found in an article written by S. Wolf and R. N. Tauber published on page 443 vol. 1, 1986 in the journal Lattice Press with the title "Silicon Processing for the VLSI Era".

Figure 3C:
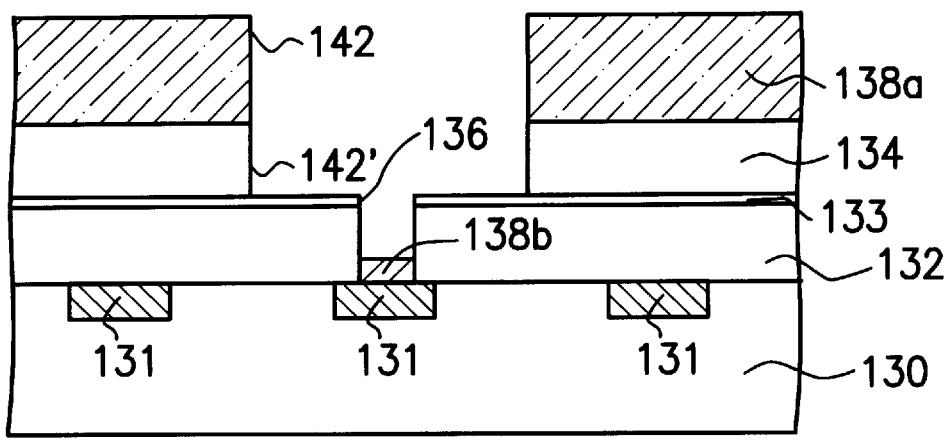

Next, as shown in FIG. 3C, using the horizontal trench pattern 142 as a mask and the dielectric layer 133 as an etching stop layer, etching is carried out. For example, an anisotropic etching operation is used to transfer the horizontal trench pattern 142 in the photoresist layer 138a downward to the dielectric layer 134, thereby forming a horizontal trench 142'. If the dielectric layer 134 is an oxide layer, a dry etching method is preferably used and the whole operation is conducted inside a high-density plasma (HDP) oxide etching machine employing a gaseous mixture that includes argon having a flow rate of about 50 sccm to 150 sccm, trifluoromethane having a flow rate of about 10 sccm to 50 sccm and fluorobutane ($C_4F_8$) having a flow rate of about 0 sccm to 22 sccm. Because there is a protective residual photoresist layer 138b above the metallic layer 131, damages to the metallic layer 131 when the dielectric layer 134 is patterned to form the horizontal trench 142' is reduced to a minimum.

Figure 3D:
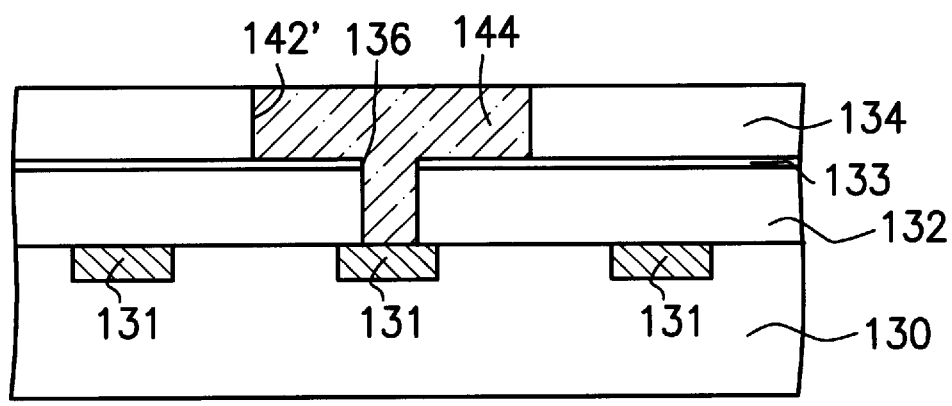

Next, as shown in FIG. 3D, the photoresist layers 138a and 138b are removed, for example, by a wet etching method using oxygen plasma or a solution composed of sulfuric acid, hydrogen peroxide, and ammonium hydroxide. Thereafter, metallic material 144, or example, copper or copper-aluminum alloy, is deposited into the horizontal trench 142' and the vertical window 136. Finally, a chemical-mechanical polishing (CMP) operation is performed to remove the excess metal above the dielectric layer 134 to form a dual damascene interconnect structure.

As a summary, the characteristics of using this method of fabrication include:

1. Through the presence of a residual photoresist layer over the metallic layer 131 at the bottom of the vertical window 136, the metallic layer 131 in the substrate is protected against etchant when the horizontal trench pattern 142 is subsequently transferred to the dielectric layer 134.
2. The residual photoresist layer 138b is formed by applying a dose of radiation smaller than normal for molecular dissociation of the photoresist layer in the bottom part of the vertical window so that a portion of the photoresist layer will remain after development.
3. A method for increasing alignment accuracy between the conductive layer and the interconnecting window pattern underneath is provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a T-shaped opening comprising:
   providing a substrate having a device region formed thereon;
   forming a first dielectric layer, a second dielectric layer and then a third dielectric layer in sequence to form a stack dielectric layers;
   planarizing the third dielectric layer;
   patterning the stack of dielectric layers to form a vertical window exposing the device region;
   forming a photoresist layer over the third dielectric layer;
   patterning the photoresist layer to form a horizontal trench pattern above the third dielectric layer as well as to retain a portion of the original photoresist layer at the bottom of the vertical window forming a residual photoresist layer;
   using the photoresist layer above the third dielectric layer as a mask and the residual photoresist layer at the bottom of the vertical window as a protective cover for the metallic layer in the substrate when the third dielectric layer is etched to form a horizontal trench; and
   removing the photoresist layer in order to form a T-shaped opening constructed from the top horizontal trench and the bottom vertical window.

2. The method of claim 1, wherein step of planarizing the third dielectric layer includes a chemical-mechanical polishing method.

3. The method of claim 1, wherein the step of planarizing the third dielectric layer includes an etching back method or a capping method.

4. The method of claim 1, wherein the step of forming the first dielectric layer includes depositing phosphosilicate glass.

5. The method of claim 1, wherein the step of forming the second dielectric layer includes depositing silicon nitride.

6. The method of claim 1, wherein the step of forming the third dielectric layer includes depositing phosphosilicate glass.

7. The method of claim 1, wherein the step of forming the photoresist layer includes depositing positive photoactive material.

8. The method of claim 1, wherein the step of forming the photoresist layer includes exposing and developing the photoresist layer, so that a horizontal trench pattern is transferred from the photomask to the photoresist layer while a portion of the photoresist layer will remain at the bottom of the vertical window.

9. The method of claim 8, wherein the dose of light applied to the photoresist layer is insufficient to cause the photoresist layer near the bottom of the vertical window to react, so that a portion of the photoresist layer at the bottom of the vertical window will remain after development.

10. The method of claim 8, wherein the photomask for transferring the horizontal trench pattern to the photoresist layer includes a dark field mask.

11. The method of claim 1, wherein the step of etching the third dielectric layer to form the horizontal trench includes using the second dielectric layer as an etching stop layer.

12. The method of claim 1, wherein the step of removing the photoresist layer includes a dry etching method using oxygen plasma.

13. The method of claim 1, wherein the step of removing the photoresist layer includes a wet etching method using a solution containing sulfuric acid, hydrogen peroxide and ammonium hydroxide.

14. A method for forming dual damascene metallic pattern comprising:
   providing a substrate having a patterned metallic layer formed thereon;
   forming a first dielectric layer, a second dielectric layer and then a third dielectric layer in sequence to form a stack dielectric layers;
   planarizing the third dielectric layer;
   patterning the stack of dielectric layers to form a vertical window exposing the metallic layer;
   forming a photoresist layer over the third dielectric layer;

patterning the photoresist layer to form a horizontal trench pattern above the third dielectric layer as well as to retain a portion of the original photoresist layer at the bottom of the vertical window as a residual photoresist layer;

using the photoresist layer above the third dielectric layer as a mask and the residual photoresist layer at the bottom of the vertical window as a protective cover for the metallic layer in the substrate when the third dielectric layer is etched to form a horizontal trench;

removing the photoresist layer; and depositing metallic material into the vertical window and the horizontal trench to form a dual damascene metallic pattern.

15. The method of claim 14, wherein step of planarizing the third dielectric layer includes a chemical-mechanical polishing method.

16. The method of claim 14, wherein the step of forming the first dielectric layer includes depositing phosphosilicate glass.

17. The method of claim 14, wherein the step of forming the second dielectric layer includes depositing silicon nitride.

18. The method of claim 14, wherein the step of forming the third dielectric layer includes depositing phosphosilicate glass.

19. The method of claim 14, wherein the step of forming the photoresist layer includes depositing positive photoactive material.

20. The method of claim 14, wherein the step of forming the photoresist layer includes irradiating the photoresist layer with light of such intensity that when the irradiated photoresist layer is developed, a horizontal trench pattern is transferred from the photomask to the photoresist layer while a portion of the photoresist layer will remain at the bottom of the vertical window.

21. The method of claim 20, wherein the dose of irradiation applied to the photoresist layer is insufficient to cause the photoresist layer near the bottom of the vertical window to react, so that a portion of the photoresist layer at the bottom of the vertical window will remain after development.

22. The method of claim 20, wherein the photomask for transferring the horizontal trench pattern to the photoresist layer includes a dark field mask.

23. The method of claim 14, wherein the step of etching the third dielectric layer to form the horizontal trench includes using the second dielectric layer as an etching stop layer.

24. The method of claim 14, wherein the step of removing the photoresist layer includes a dry etching method using oxygen plasma.

25. The method of claim 14, wherein the step of removing the photoresist layer includes a wet etching method using a solution containing sulfuric acid, hydrogen peroxide and ammonium hydroxide.

26. The method of claim 14, wherein the step of depositing metallic material into the vertical window and horizontal trench includes depositing copper.

27. The method of claim 14, wherein the step of depositing metallic material into the vertical window and horizontal trench includes depositing copper-aluminum alloy.

* * * * *